US011211222B2

(12) United States Patent
Flanagan et al.

(10) Patent No.: US 11,211,222 B2
(45) Date of Patent: Dec. 28, 2021

(54) METHOD AND SYSTEM FOR AUTOMATIC ZONE AXIS ALIGNMENT

(71) Applicant: FEI Company, Hillsboro, OR (US)

(72) Inventors: John J. Flanagan, Hillsboro, OR (US); Nathaniel Kurtz, Hillsboro, OR (US); Ashley Tilson, Hillsboro, OR (US); Phillip Parker, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 39 days.

(21) Appl. No.: 16/730,998

(22) Filed: Dec. 30, 2019

(65) Prior Publication Data

US 2021/0202205 A1    Jul. 1, 2021

(51) Int. Cl.
*H01J 37/244* (2006.01)
*H01J 37/28* (2006.01)
*G01N 23/20058* (2018.01)
*H01J 37/22* (2006.01)

(52) U.S. Cl.
CPC ...... *H01J 37/244* (2013.01); *G01N 23/20058* (2013.01); *H01J 37/222* (2013.01); *H01J 37/28* (2013.01); *H01J 2237/1501* (2013.01); *H01J 2237/2823* (2013.01)

(58) Field of Classification Search
USPC ....................................................... 250/311
See application file for complete search history.

(56) References Cited

U.S. PATENT DOCUMENTS

| 8,686,359 | B2 * | 4/2014 | Zewail | H01J 37/22 250/307 |
| 9,978,557 | B2 | 5/2018 | Flanagan, IV | |
| 10,067,078 | B1 | 9/2018 | Zhang et al. | |
| 2019/0317451 | A1 * | 10/2019 | Supikov | G06K 9/4661 |
| 2020/0340901 | A1 * | 10/2020 | Ozcan | G01N 15/0227 |
| 2021/0042620 | A1 * | 2/2021 | Chen | G06N 3/0454 |
| 2021/0209337 | A1 * | 7/2021 | Ozcan | G01N 15/1484 |

OTHER PUBLICATIONS

K. Gries et al., "Correlation of the orientation of stacked aragonite platelets in nacre and their connection via mineral bridges", Ultramicroscopy 109 (2009), pp. 230-236. (Year: 2009).*
Zimmermann; et. al.,"Deep neural networks for classifying complex features in diffraction images", physics.data-an, Mar. 13, 2019, pp. 1-18. (Year: 2019).*
Skourikhine; et. al., "Neural Network for Image Segmentation", Proceedings of SPIE—The International Society for Optical Engineering, Aug. 2002, pp. 1-8. (Year: 2002).*
J. Jansen et al, Towards Automatic Alignment of a Crystalline Sample in an Electron Microscope Along a Zone Axis; Ultramicroscopy, Feb. 2013, pp. 59-65, vol. 125, Elsevier.

* cited by examiner

*Primary Examiner* — Phillip A Johnston

(57) ABSTRACT

Automatic alignment of the zone axis of a sample and a charged particle beam is achieved based on a diffraction pattern of the sample. An area corresponding to the Laue circle is segmented using a trained network. The sample is aligned with the charged particle beam by tilting the sample with a zone axis tilt determined based on the segmented area.

20 Claims, 7 Drawing Sheets

METHOD AND SYSTEM FOR AUTOMATIC ZONE AXIS ALIGNMENT

FIELD OF THE INVENTION

The present description relates generally to methods and systems for aligning a sample with an incident beam, and more particularly, to automatically aligning a zone axis of a crystalline sample with a charged particle beam.

BACKGROUND OF THE INVENTION

For high resolution charged particle beam microscopy, in order to image a crystalline sample with high accuracy, the charged particle beam has to be aligned with a zone axis of the crystalline sample. If the zone axis of the sample is misaligned, such as when the zone axis is not oriented parallel to the incident beam, the measurement of the nanoscale features on the sample may be inaccurate. The process of aligning the sample's crystal structure with the incident beam is referred to as zone axis alignment.

One method of zone axis alignment is based on diffraction patterns formed with a parallel beam. When the parallel charged particle beam passes through a thin crystalline sample, the charged particles interfere with each other and form a diffraction pattern on the back focal plane of an objective lens positioned below the sample. The diffraction pattern consists of multiple bright diffraction spots. Diffraction spots belonging to the zero order Laue circle may be determined, and the zone axis misalignment may be determined based on the locations of the center of the zero order Laue circle and the center of the direct beam. However, Applicant recognizes that under certain conditions, diffraction spots of the zero order Laue circle cannot be easily identified. As one example, when the sample is curved, or bendy, diffraction spots of different zone axis orientations may be mixed in the diffraction pattern. As another example, under irradiation of a convergent beam, the diffraction spots become disks and may be elongated and overlapped with each other and/or the direct beam.

SUMMARY

In one embodiment, a zone axis of the sample may be aligned using a method that comprises directing a charged particle beam towards a sample; acquiring a diffraction pattern of the sample; segmenting an area of the diffraction pattern corresponding to a Laue circle using a trained network; determining a zone axis tilt based on the segmented area; and tilting the sample based on the determined zone axis tilt. In this way, zone axis of a bendy sample may be automatically aligned based on diffraction pattern acquired with a convergent beam.

It should be understood that the summary above is provided to introduce, in simplified form, a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for aligning the zone axis of a sample with a charged particle beam. In order to perform high resolution imaging, such as high-resolution scanning transmission electron microscopy (STEM) imaging using imaging system of FIG. 1, the zone axis of the crystalline sample has to be parallel with the incident beam. In STEM, responsive to the charged particles irradiated on one side of the sample, charged particles including the transmitted charged particles, scattered electrons and second electrons are detected on the other side of the sample via a detector.

Figure 2A:
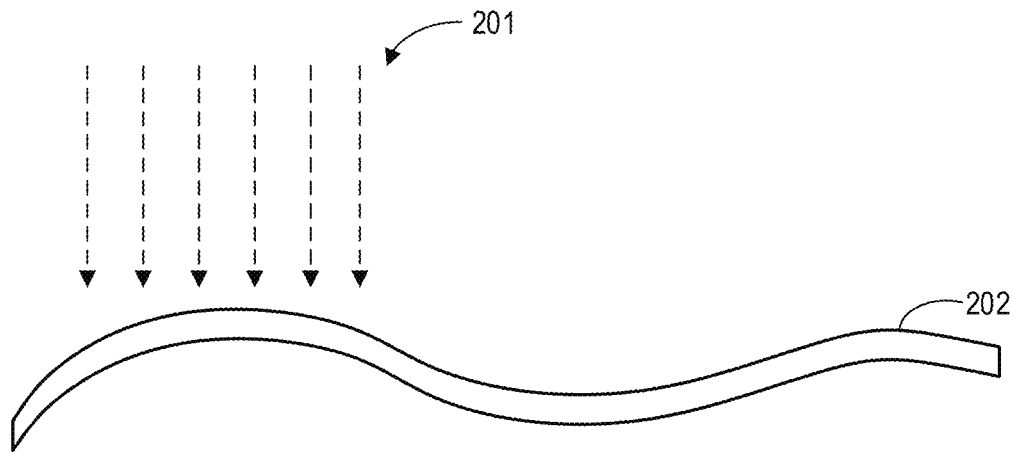
FIGS. 2A and 2B illustrate relationship between the incident beam and the sample.
Figure 2B:
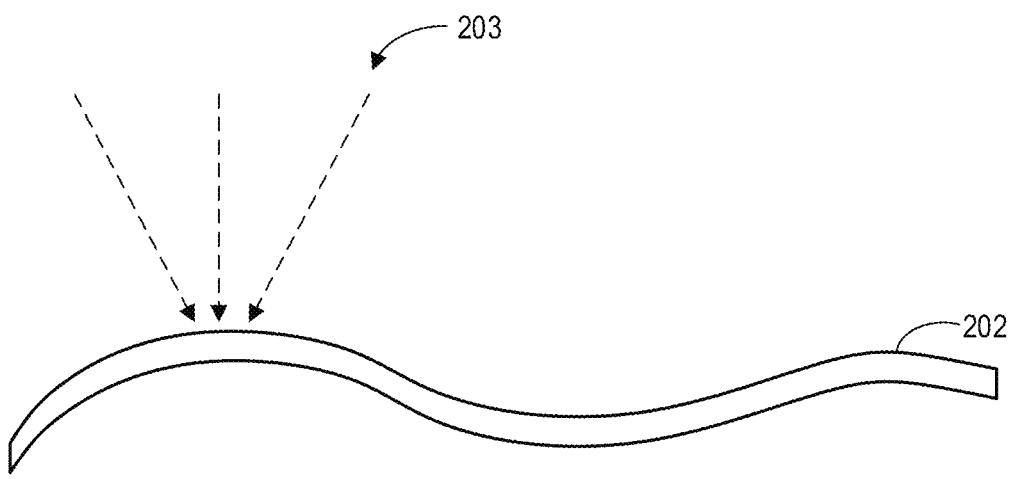

The sample imaged under the transmission mode may bend due to reduced sample thickness or poor mechanical support. As one example, the sample may have a curvature greater than 5 degrees within a small area of 2 um$^2$. As shown in FIG. 2A, because sample 202 under irradiation of parallel beam 201 is not flat, diffraction spots from different crystal orientations may be mixed in the diffraction pattern. As a result, aligning the charged particle beam with one orientation among the multiple crystal orientations based on the diffraction pattern is difficult. In the contrast, due to its small beam profile on the sample surface, a diffraction pattern acquired with convergent beam 203, as shown in FIG. 2B, is formed from sample with uniform crystal orientation. However, the diffraction pattern formed with the convergent beam is more complicated than the diffraction pattern formed with the parallel beam. Unlike the point like high intensity diffraction spots in the parallel diffraction pattern, diffraction spots formed with convergent beam diffraction pattern are disk like, elongated, and overlapped with each other and with the direct beam.

Figure 3:
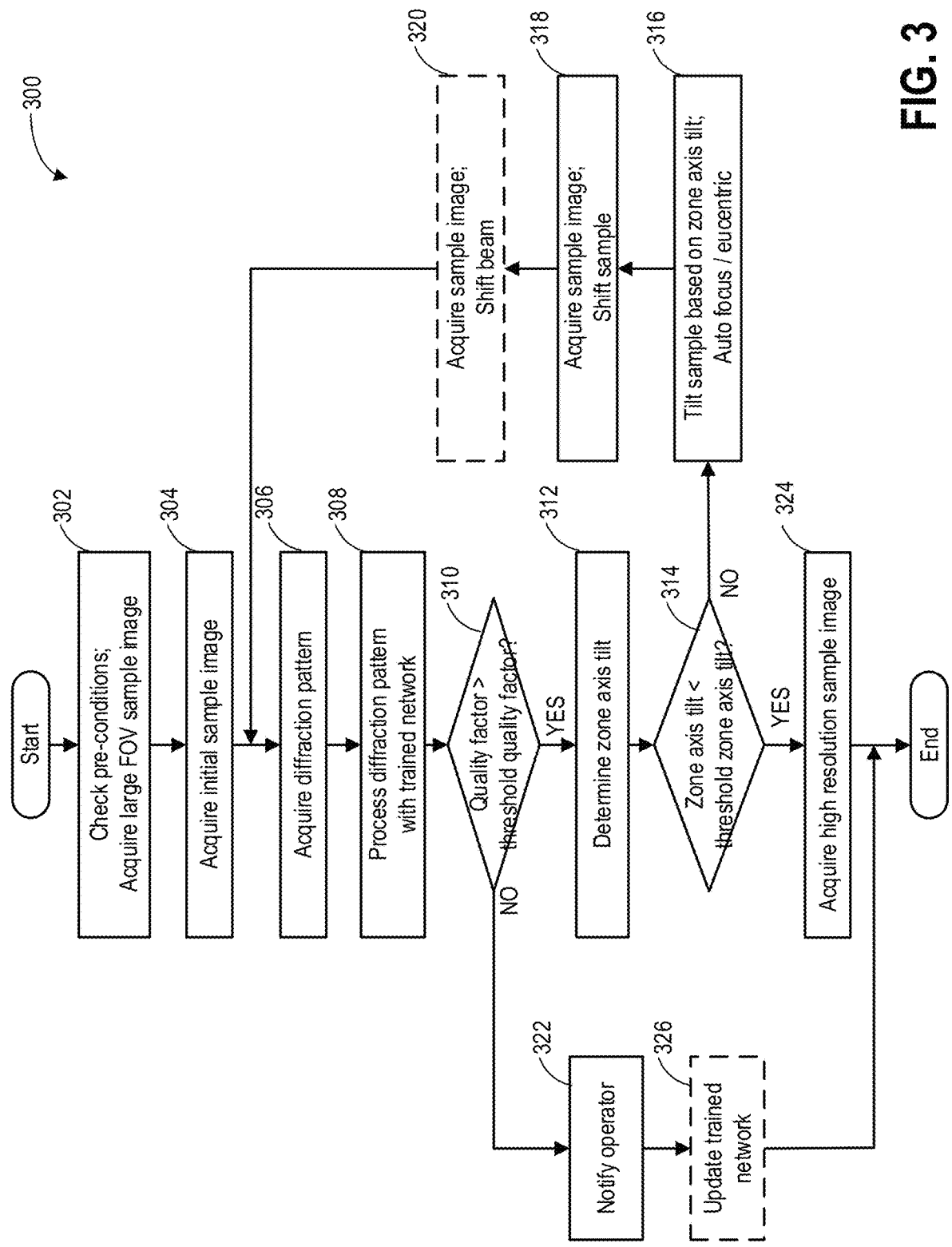
FIG. 3 is a high-level flowchart of a method for zone axis alignment.
Figure 4:
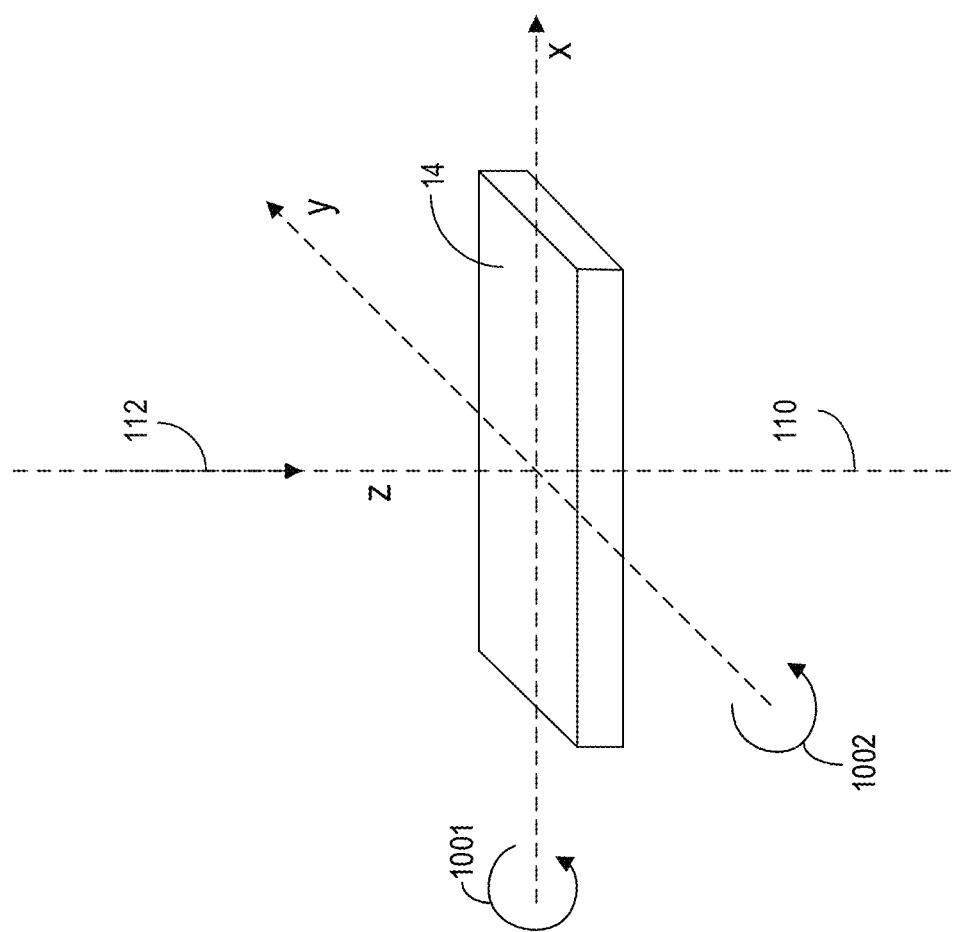
FIG. 4 illustrates the coordinate system for adjusting the sample orientation.
Figure 5A:
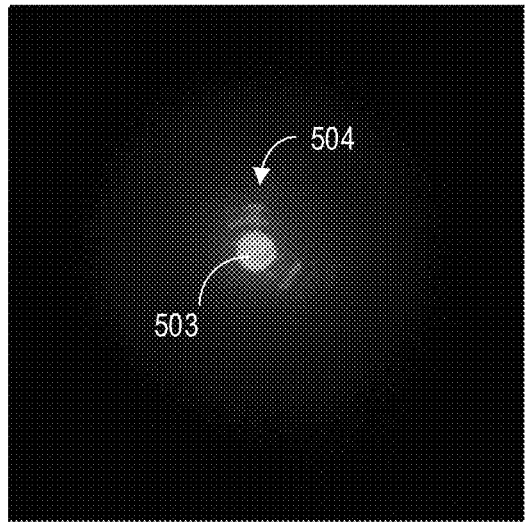
FIG. 5A is an example diffraction pattern acquired with convergent beam.
Figure 5B:
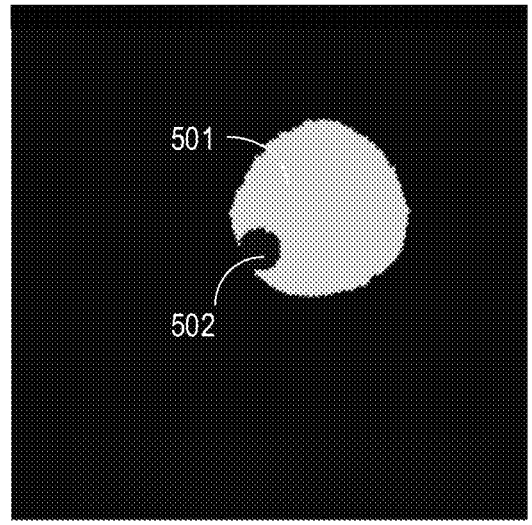
FIG. 5B shows the output of the trained network.

FIG. 3 shows a method for zone axis alignment based on the diffraction pattern. The diffraction pattern may be acquired using a convergent beam or a parallel beam. A first area corresponding to the Laue circle and a second area corresponding to the direct beam in the diffraction pattern are segmented from the diffraction pattern using a trained network. A quality factor, representing quality of the segmentation, is generated based on the output of the trained network. In one example, the quality factor is generated based on the shape of the segmented area corresponding to the Laue circle. In another example, the quality factor is generated based on the relative position of the two segmented areas. The zone axis tilt may be determined based on the locations of the segmented areas. For example, the angles of zone axis tilt in two orthogonal tilt directions are derived based on the relative position of the center of the first segmented area and the center of the second segmented area. The sample orientation may be adjusted based on the zone axis tilt to align the zone axis of the sample with the incident beam. The sample orientation may be further adjusted till the zone axis tilt converges to a threshold zone axis tilt. FIG. 4 shows the coordinate system for adjusting the sample orientation. FIGS. 5A-5B show example results of the zone axis alignment.

Figure 6:
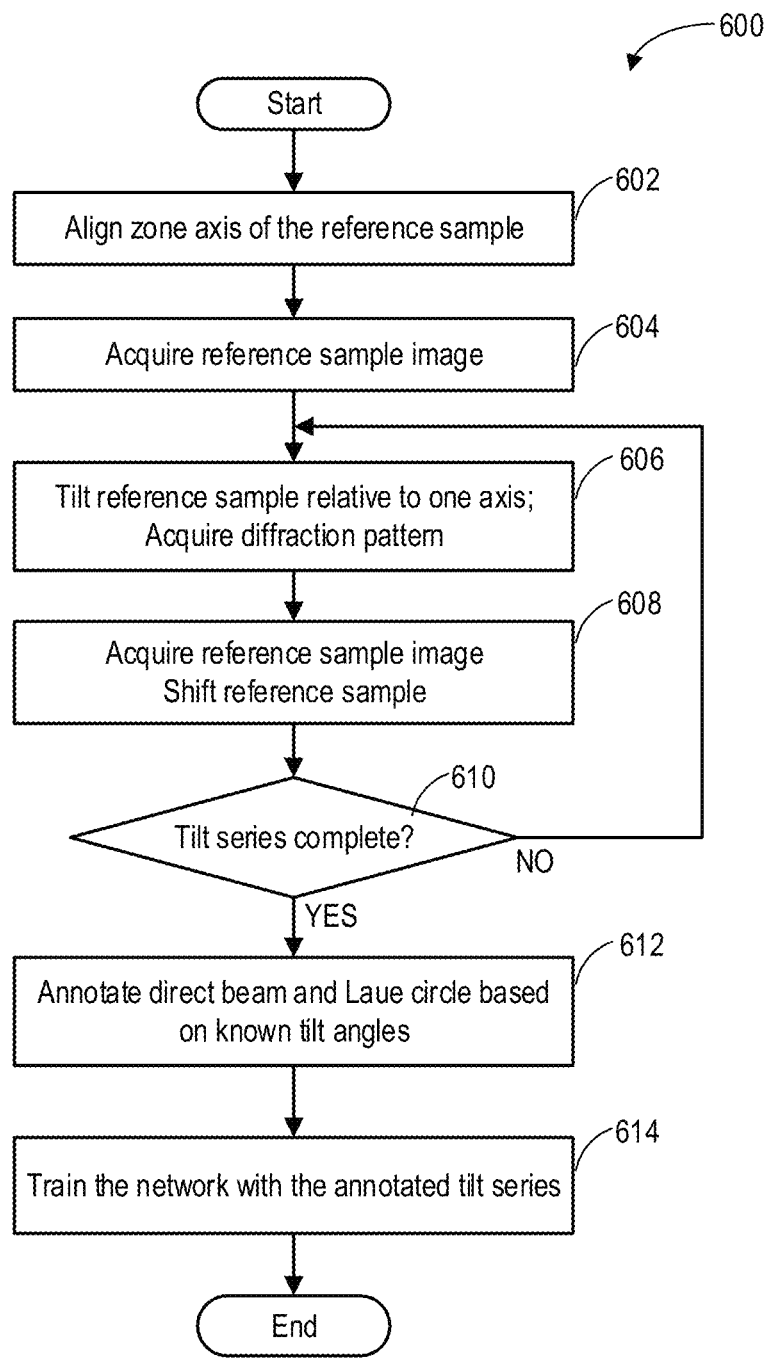
FIG. 6 is a flowchart of a method for training a network.
Figure 7B:
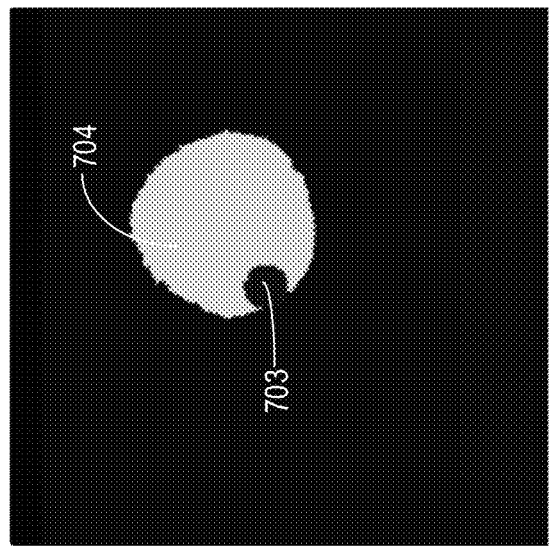
FIG. 7B shows an example output of the network.
Figure 7A:
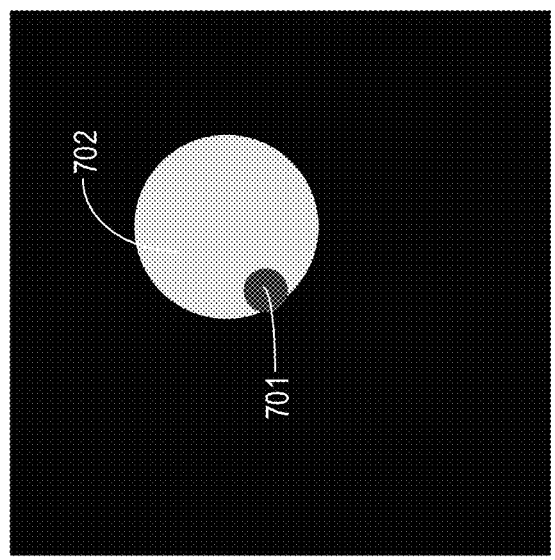
FIG. 7A shows an example annotated diffraction pattern.

A method for generating the trained network is shown in FIG. 6. The network may be trained with multiple diffraction patterns acquired by tilting a reference sample at multiple tilt angles. The diffraction pattern of the reference sample may be acquired under the same beam conditions as the sample for imaging. The areas of the Laue circle and the direct beam in the multiple diffraction patterns are automatically annotated based on the known tilt angles. The areas of the Laue circle and the direct beam may each be a circle. The multiple diffraction patterns and the annotated diffraction patterns are used for training the network. The network outputs two segmented areas corresponding to the Laue circle and the direction beam in the diffraction pattern. The parameters of the network may be adjusted based on the similarity between the segmented Laue circle and the annotated Laue circle. FIGS. 7A-7B show example annotated diffraction pattern and the network output.

Figure 1:
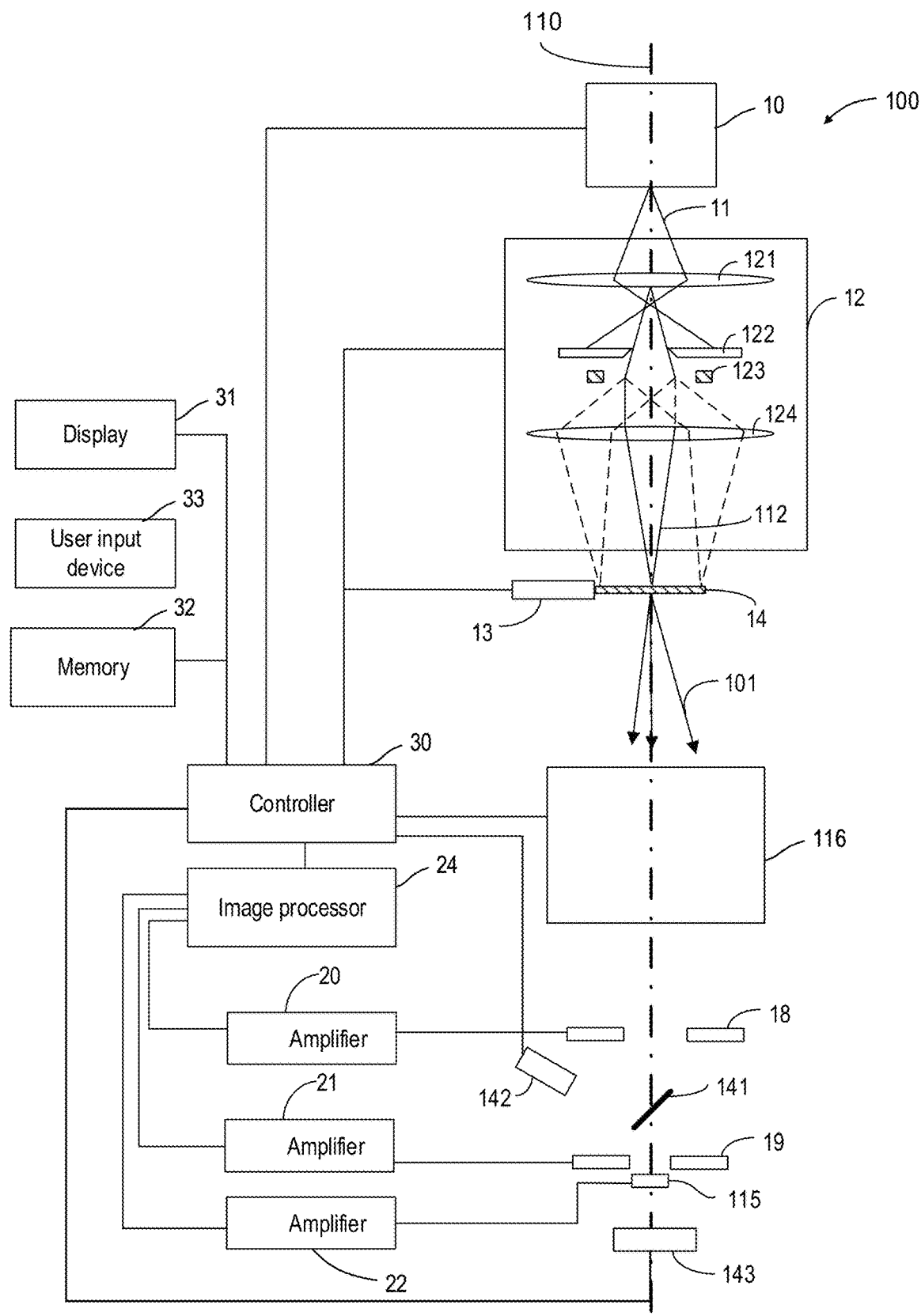
FIG. 1 shows a system for imaging a sample, according to some embodiments.

Turning to FIG. 1, a STEM system 100 in accordance with an embodiment of the disclosure is shown. The STEM system 100 includes an electron source 10 that emits charged particles, such as electron beam 11, towards a focusing column 12. The electron beam may generate high energy electrons, that is, electrons having typical energies of between about 10 keV and 1,000 keV. In some embodiments, the focusing column 12 may include one or more of a condenser lens 121, aperture 122, scan coils 123, and upper objective lens 124. The focusing column 12 focuses electrons from electron source 10 into a small spot on sample 14. Different locations of the sample may be scanned by adjusting the electron beam direction via the scan coils 123. For example, by operating scan coils 123, incident beam 112 may be shifted or scanned (as shown with dashed lines) to focus onto different locations of sample 14. The sample 14 may be thin enough to not impede transmission of most of the electrons in the electron beam 11.

Primary axis 110 of the imaging system may be the central axis of the electron beam emitted from the electron source 10. Primary axis 110 may also be the central axis of the condenser lens 121. When the incident beam is not shifted or scanned (that is, incident beam 112), the incident beam may be focused at the location where the primary axis 110 intersects the sample 14.

The sample 14 may be held by a sample holder 13. The sample holder 13 may adjust sample orientation by tilting and/or translating the sample. As an example, FIG. 4 illustrates the coordination system for adjusting the sample orientation. In FIG. 4, the incident beam 112 may be focused on sample 14 along the primary axis 110 of the imaging system. The z-axis may be parallel to the primary axis 110. The x-y plane may be a plane perpendicular to the z-axis. The sample 14 may be tilted relative to the primary axis 110 by rotating around the x-axis or around the y-axis. For example, the rotation direction around the x-axis may be the alpha tilt direction 1001, and the rotation direction around the y-axis may be the beta tilt direction 1002. The sample holder may also translate or shift the sample 14 along any of the x-axis, y-axis, and z-axis. In some embodiments, the sample 14 may be rotated around the z-axis.

Turning back to FIG. 1, electrons 101 passing through sample 14 may enter projector 116. In one embodiment, the projector 116 may be a separate part from the focusing column. In another embodiment, the projector 116 may be an extension of the lens field from a lens in focusing column 12.

The projector 116 may be adjusted by the controller 30 so that direct electrons passed through the sample, impinge on disk-shaped bright field detector 115, while diffracted or scattered electrons, which were more strongly deflected by the sample, are detected by one or more of a high-angle annular dark-field (HAADF) detector 18 and a annular dark-field (ADF) detector 19. Signals from the HAADF and ADF detectors may be amplified by amplifier 20 and amplifier 21, respectively. Signals from bright field detector 115 may be amplified by amplifier 22. Signals from the amplifiers 20, 21, and 22 may be sent to image processor 24, which can form an image of sample 14 from the detected electrons. The HAADF detector 18, ADF detector 19, and bright field detector 115 may be a scintillator-photomultiplier detector, a solid-state PIN detector, or a metal plate. The STEM system 100 may simultaneously detect signals from one or more of the ADF detector, the ADF detector, and the HAADF detector.

The zone axis of the sample 14 may be aligned with the incident beam 112 based on diffraction patterns of the sample 14 acquired when irradiating the sample with incident beam 112. In one embodiment, the diffraction pattern may be acquired via camera 142 by capturing the diffraction pattern formed on the flu-screen 141. The flu-screen 141 may be inserted between the projector 116 and the bright field detector 115 during zone axis alignment. For example, the flu-screen 141 may be positioned between the HAADF detector 18 and ADF detector 19. The HAADF detector may be retracted for acquiring the diffraction pattern. In another embodiment, the diffraction pattern on the flu-screen may be captured via camera 143 positioned downstream of the bright field detector 115. The camera 143 may be CCD or CMOS camera. In some embodiments, the diffraction pattern may be acquired by a pixelated detector. The pixelated detector may also be used for detecting one or more of the bright field, ADF, and HAADF images. The acquired diffraction patterns may be sent to the controller 30 for determining the zone axis tilt.

The controller 30 may control the operation of the imaging system 100, either manually in response to operator instructions or automatically in accordance with computer readable instructions stored in non-transitory memory 32. The controller 30 can be configured to execute the computer readable instructions and control various components of the imaging system 100 in order to implement any of the methods described herein. For example, the controller may adjust the beam location on the sample by operating the scan coils 123. The controller may adjust the profile of the incident beam by adjusting one or more apertures and/or lens in the focusing column 12. The controller may adjust the sample orientation relative to the incident beam by tilting the sample holder 13. The controller may shift the sample relative to the incident beam by translating the sample holder 13. The controller 30 may further be coupled to a display 31 to display notifications and/or images of the sample. The controller 30 may receive user inputs from user input device 33. The user input device 33 may include keyboard, mouse, or touchscreen.

Though a STEM system is described by way of example, it should be understood that the present techniques may be used for zone axis alignment with collimated incident beam.

The present techniques may also be useful when applied to sample alignment in other charged particle beam microscopy systems, such as transmission electron microscopy (TEM) system, scanning electron microscopy (SEM) system, and dual beam microscopy system. The present discussion of STEM imaging is provided merely as an example of one suitable imaging modality.

FIG. 3 shows method 300 for aligning zone axis of a sample with the incident beam in an imaging system such as the STEM system of FIG. 1. The sample may be curved or bendy. In one example, the sample has a curvature equal or greater than 0.5 degree in an area of 2 $um^2$. In another example, the sample has a curvature equal or greater than 5 degrees in an area of 2 $um^2$. The zone axis at a particular sample location may be automatically aligned with the incident beam (such as primary axis 110 of FIG. 1) based on the convergent beam diffraction pattern.

At 302, conditions of the imaging system are checked. Checking system conditions may include checking one or more of whether the system is operational, whether a suitable sample is inserted, and whether the desired system settings are in place. An operational system may include, but is not limited to, open columns valves, working electron source, and functional system vacuum. The system settings include, but are not limited to, desired aperture size, condenser lens current, beam position, camera length, electron potential, and beam current. Step 302 also includes acquiring a low-resolution large field of view (FOV) sample image. The sample image may be a STEM image. The sample image may be used for locating the region of interest (ROI) for high resolution imaging. For example, the large FOV STEM image is acquired at 5,000× magnification.

At 304, an initial sample image of the ROI is acquired. The initial sample image has a higher resolution and smaller FOV than the sample image acquired at 302. The initial sample image may be acquired by the HAADF detector.

At 306, a diffraction pattern of the sample is acquired. The diffraction pattern may be acquired by focusing the charged particle beam at a point within the ROI. As an example, the diffraction pattern is acquired by focusing the charged particle beam at the center of the ROI and receiving the charged particles with the detector in the transmission mode. The HAADF detector is retracted during the diffraction pattern acquisition. The diffraction pattern may be acquired with camera 143 of FIG. 1.

At 308, the trained network receives the diffraction pattern, and outputs two segmented areas of the diffraction pattern. FIG. 5A shows an example diffraction pattern formed with a convergent charged particle beam. The direct beam 503 is a bright circle resulting from the incident beam transmitted through the sample directly hitting the detector without scattering. The diffraction spots 504 of the Laue circle are overlapped with the direct beam. FIG. 5B shows the output of the trained network. The output of the trained network is an image with the same size (or pixels) as the diffraction pattern. The output image includes two segmented areas 501 and 502. The first segmented area 501 corresponds to the Laue circle, and the second segmented area 502 corresponds to the direct beam.

At 310, a quality factor representing the quality of the trained network output (or the segmentation quality of the trained network) is compared with a threshold quality factor. In one example, the quality factor is determined based on the shape of the segmented area corresponding to the Laue circle. The quality factor is higher if the shape of segmented Laue circle in the diffraction pattern is closer to a circle. In another example, the quality factor is low if the two segmented areas are non-disjoint. In yet another example, the quality factor may be determined based on a degree of overlap between the two segmented areas. The quality factor is higher if the degree of overlap is higher. If the quality factor is greater than a predetermined threshold quality factor, method 300 proceeds to step 310, otherwise, the operator may be notified at 322.

At 326, the diffraction pattern may optionally be used for updating parameters of the trained network at 326. Step 326 also includes determining the validity of the diffraction pattern. An invalid diffraction pattern may result from non-crystalline materials, in which case zone axis alignment is not possible. If the diffraction pattern is valid, the diffraction pattern can be annotated and utilized to update and re-train the trained network.

At 312, the zone axis tilt is determined based on the network output. The zone axis tilt includes tilt angles relative to two orthogonal axes (such as the alpha tilt and the beta tilt relative to x-axis and y-axis of FIG. 4). The zone axis tilt may be determined based on the locations of the centers of the two segmented areas in the trained network output. In one example, the center of each segmented area may be the geometric center of the segmented area. In another example, one or more of the segmented areas may be fitted with a circle. The center of the segmented area is the center of the fitted circle. In yet another example, only the area corresponding to Laue circle, but not the area corresponding to the direct beam is segmented using the trained network. The direct beam location may be in a fixed known location, in which case only the segmented area of the Laue circle is necessary.

Figure 5C:
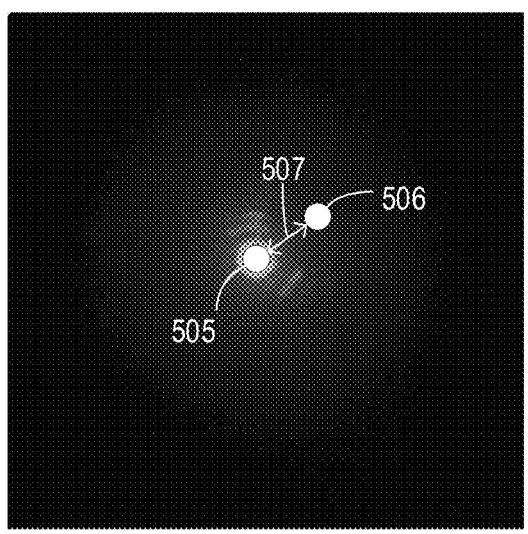
FIG. 5C shows locations of the Laue circle center and the direct beam center.

FIG. 5C shows center 505 of segmented direct beam 502, and the center 506 of segmented Laue circle 501 of the network output FIG. 5B. The centers are shown with respect to the diffraction pattern FIG. 5A. The distance 507 between the centers of the two segmented areas increases with the degree of misalignment between the zone axis and the incident beam axis. The zone axis tilt increases with the distance 507. The distance 507 on each of the two orthogonal axes (such as x-axis and y-axis of FIG. 4) increases with the increased zone axis tilt angle around the axis.

At 314, the zone axis tilt determined at 312 is compared with a threshold zone axis tilt to assess the degree of misalignment. In one example, the zone axis tilt in alpha and beta directions may be compared with the threshold alpha and beta zone tilt threshold, respectively. The alpha and beta zone axis tilt threshold may be 0.5 degree. If the zone axis tilt is smaller than the threshold zone axis tilt, the zone axis is aligned, and method 300 proceeds to 324 to acquire the high-resolution sample image. Otherwise, the sample is tilted at 316 to align the zone axis of sample with the incident beam.

In another example, instead of the zone axis tilt, the degree of overlap between the direct beam and Laue circle is compared with a threshold overlap to assess the degree of misalignment. The method may proceed to 324 responsive to the degree of overlap greater than the threshold overlap.

At 316, the sample orientation is adjusted based on the zone axis tilt. For example, the sample is tilted relative to the two orthogonal axes by the zone axis tilt. Right after the sample tilting, the sample height and/or the focus of the charged particle beam on the sample surface is adjusted.

Figure 5D:
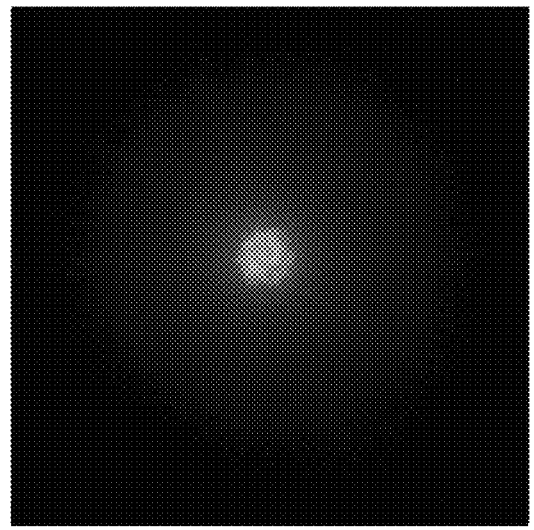
FIG. 5D is the diffraction pattern of the sample with zone axis aligned with the incident beam.

FIG. 5D shows the diffraction pattern of the sample after adjusting sample orientation based on the zone axis tilt. The diffraction spots of the Laue circle converge to and overlap with the direct beam. The centers of the Laue circle and the direct beam also overlap with each other.

At 318, after tilting the sample, a second sample image is acquired, and the sample is shifted based on the comparison between the second sample image and the initial sample image. The sample is shifted by operating the sample holder, such as sample holder 13 of FIG. 1. The second sample image is acquired with the same parameter as the initial sample image acquired at 304. The second image may be acquired by the HAADF detector after inserting the HAADF detector into the beam path. The sample is shifted in the x-y plane shown in FIG. 4 based on the displacement between the second sample image and the initial sample image. The sample is shifted to compensate for the sample drift and tilt induced mechanical shift caused by tilting the sample. Step 318 may be skipped if the system has an eucentric holder in both orthogonal directions and sample drift is minimal. The eucentric holder maintains the eucentricity of the sample and does not cause sample drift/shift during sample tilting.

At 320, a third sample image may optionally be acquired, and the charged particle beam is shifted based on the comparison between the third sample image and the initial sample image. The beam shift may be achieved by operating the scan coils 123 of FIG. 1. The third sample image is acquired with the same parameter as the initial sample image acquired at 304. The sample is shifted in the x-y plane shown in FIG. 4 based on the displacement between the third sample image and the initial sample image. The beam shift can achieve a higher resolution shift between the sample and the incident beam compared to shifting the sample using the sample holder at 318. If the sample holder has sufficient shift precision, this step is not required.

If the determined zone axis tilt is less than a threshold zone axis tilt at 314, high resolution image of the sample is acquired at 324. The resolution of the acquired sample image is higher than the sample images acquired for zone axis alignment or sample drift compensation (such as sample images acquired at 304, 318, and 320).

In some examples, the trained network may only segment the area corresponding to the Laue circle. The center of the Laue circle may be determined based on the segmented area. The center of the direct beam may be predetermined, such as the center of the diffraction pattern. The sample may be tilted based on the positions of the Laue circle center and the direct beam center in the diffraction pattern.

In this way, zone axis of a curved or bendy sample is automatically aligned with the incident beam based on the convergent beam diffraction pattern of the sample. Since the convergent beam can have a beam profile (or beam cross-section at the sample surface) in the nanometer scale, crystal orientation at a small selected area may be aligned. The zone axis tilt is determined automatically based on the locations of the segmented direct beam and the segmented Laue circle in the diffraction pattern using the trained network. The quality of the network output is assessed before tilting the sample to ensure the accuracy of the zone axis tilt estimation. Though zone axis alignment using a convergent beam diffraction pattern is provided herein as an example, method 300 can also achieve automatic zone axis alignment using a parallel beam diffraction pattern.

FIG. 6 shows a method 600 for training the network with one or more reference samples. The network may comprise a single machine learning network or a plurality of machine learning network working in combination. The individual machine learning networks may correspond to a CAN, an ANN, a GAN, a FCN, a U-NET, a YOLO, a Mask R-CNN, or any other type of machine learning network capable of image segmentation. For example, the network may comprise a fully convolutional neural network. According to the present disclosure, the network is trained with multiple diffraction patterns of the one or more reference samples, and the annotated diffraction patterns.

The reference sample may be flat or have a curvature less than the sample imaged in FIG. 3. A flat reference sample ensures that acquired diffraction patterns represent the specified tilt. Otherwise, due to specimen bending, the actual tilt may not correspond to the specified tilt if the sample shifts on holder tilting. If sample drift compensation is used, as described in step 608, the need for flatness is reduced. The sample material may or may not be the same material as the imaging sample. The reference sample and the imaging sample are crystalline of the same lattice type. For example, the reference and imaging samples may be silicon near the 110 zone axis. It does not matter whether the silicon has been processed by lithography, etching, doping, or other semiconductor manufacturing processes. Support for other lattice types can be realized by including these lattice types during training. The reference sample thickness may be different or the same as the imaging sample provided the charged particle beam can transmit through the material.

At 602, the zone axis of the reference sample is aligned with the incident beam axis. The zone axis of the reference sample may be aligned manually.

At 604, an initial image of the reference sample is acquired. The reference sample image may be a STEM image for compensating sample drift.

At 606, the reference sample is tilted by a predetermined step size within a predetermined tilt range, and a diffraction pattern of the tilted reference sample is acquired. For example, the tilt step size may be 1 degree, and the tilt range may be −5 to 5 degrees in both the alpha rotation direction and the beta rotation direction. In another example, the tilt step size may vary based on the total sample tilt angle. The tilt step size may be reduced at smaller tilt angle. The diffraction pattern may be acquired with the same system configuration or parameters as during zone axis alignment of FIG. 3. For example, the diffraction pattern is acquired with the same beam convergence angle as in 304 of FIG. 3.

At 608, a second reference sample image is acquired, and the reference sample is shifted by comparing the second reference sample image with the initial reference sample image. Similar to step 314 of FIG. 3, the sample is shifted in the x-y plane to compensate for the sample drift during sample tilt at 606. Step 608 may further include shifting the incident beam based on the comparison of the second reference sample image and the initial reference sample image.

At 610, method 600 checks whether the complete tilt series is acquired. If acquisition of the tilt series is complete, method moves to 612. Otherwise, the sample is further tilted according of the predetermined step size at 606.

At 612, each diffraction pattern in the tilt series is annotated based on the known zone axis tilt corresponding to the diffraction pattern. Annotating the diffraction pattern includes masking the areas corresponding to the direct beam and the Laue circle in the diffraction pattern. The area corresponding the direct beam may be annotated based on the known direction beam location in the diffraction pattern and the known beam size, which is proportional to beam convergence angle. The area corresponding to the Laue circle may be annotated based on the known zone axis tilt angle.

In one example, as shown in the annotated diffraction pattern FIG. 7A, the direct beam and the Laue circle are represented with two circles. Circle 701 corresponds to the direct beam, and circle 702 corresponds to the Laue circle.

The center location and the radius of circle 702 are determined based on the known sample zone axis tilt from the incident beam and from the beam convergence angle.

Turning back to FIG. 6, at 614, the tilt series and the annotated tilt series are used for training the network. The network receives the diffraction pattern as input, and outputs two segmented areas corresponding to the direct beam and the Laue circle. FIG. 7B shows an example output of the network. The output is an image including a first segmented area 704 corresponding to the Laue circle and a second segmented area 703 corresponding to the direct beam. The parameters of the network may be adjusted based on the similarity of the annotated diffraction pattern FIG. 7A and the network output FIG. 7B. For example, the similarity may be calculated based on cross entropy of the two images. The training may be completed until the difference between the annotated diffraction pattern and the network output is lower than a predetermined threshold level or when the difference stops improving. Parameters of the trained network may be saved in the non-transitory memory of the system for zone axis alignment (method 300 of FIG. 3).

In some examples, the network is trained with multiple reference samples. The reference samples may have different thickness or different crystal orientations. They may be of different materials or lattice types. In some examples, the network is trained on tilt series collected at different spots of a reference sample.

In some examples, the Laue circle for network training and zone axis alignment is the zero order Laue circle. In other examples, the Laue circle may include higher order Laue circle, such as the combination of the zero order and first order Laue circles.

In some examples, the network is trained to segment only the area corresponding to the Laue circle, but not the area corresponding to the direct beam.

In this way, a trained network for segmenting the Laue circle and the direct beam is generated based on multiple diffraction patterns of one or more reference samples. Annotation for each diffraction pattern is generated automatically based on the known zone axis tilt angle of the diffraction pattern and known beam convergence angle.

What is claimed is:

1. A method for zone axis alignment, comprising:
    directing a charged particle beam towards a sample;
    acquiring a diffraction pattern of the sample;
    using a trained network, segmenting the diffraction pattern and generating a segmented area of the diffraction pattern corresponding to a Laue circle;
    determining a zone axis tilt based on the segmented area; and
    tilting the sample based on the determined zone axis tilt.

2. The method of claim 1, further comprising determining a shape of the segmented area, and determining the zone axis tilt based on the segmented area responsive to the shape of the segmented area being a circle.

3. The method of claim 1, further comprising generating a second segmented area of the diffraction pattern corresponding to a direct beam using the trained network; and determining the zone axis tilt based further on the second area.

4. The method of claim 1, wherein the charged particle beam is a convergent charged particle beam.

5. The method of claim 1, wherein the charged particle beam is a parallel charged particle beam.

6. The method of claim 1, further comprising generating the trained network by training a network with multiple diffraction patterns acquired with the charged particle beam.

7. The method of claim 1, further comprising generating the trained network by training a network with multiple diffraction patterns of a second sample, the second sample with a curvature less than the sample.

8. The method of claim 7, wherein training the network with the multiple diffraction patterns of the second sample includes:
    acquiring the multiple diffraction patterns of the second sample by tilting the second sample along two orthogonal axes with known tilt angles;
    annotating a direct beam and the Laue circle in the multiple diffraction patterns based on the known tilt angles; and
    training the network with the acquired multiple diffraction patterns and the multiple annotated diffraction patterns.

9. The method of claim 8, wherein training the network with the acquired multiple diffraction patterns and the multiple annotated diffraction patterns includes:
    inputting the multiple diffraction patterns to the network; and
    adjusting parameters of the network by comparing output of the network with the multiple annotated diffraction patterns.

10. A method for zone axis alignment, comprising:
    directing a convergent charged particle beam towards a sample;
    acquiring a diffraction pattern of the sample;
    using a trained network, segmenting the diffraction pattern and generating a first segmented area in the diffraction pattern corresponding to a Laue circle and a second segmented area in the diffraction pattern corresponding to a direct beam;
    determining a zone axis tilt based on the first segmented area and the second segmented area; and
    tilting the sample based on the determined zone axis tilt.

11. The method of claim 10, further comprising:
    acquiring a diffraction pattern tilt series including multiple diffraction patterns; annotating the diffraction pattern tilt series by annotating the direct beam and the Laue circle in each diffraction pattern of the diffraction pattern tilt series; and
    training the network using the acquired diffraction pattern tilt series and the annotated diffraction pattern tilt series.

12. The method of claim 11, wherein the annotated direct beam and the annotated Laue circle are circles.

13. The method of claim 10, further comprising determining a quality factor based on the first area and the second area; and determining a zone axis tilt based on the first segmented area and the second segmented area includes determining the zone axis tilt responsive to comparing the quality factor with a threshold quality factor.

14. The method of claim 13, determining the quality factor based on the first segmented area and the second segmented area includes determining the quality factor based on a degree of overlap between the first segmented area and the second segmented area.

15. The method of claim 13, determining the quality factor based on the first segmented area and the second segmented area includes determining the quality factor based on a shape of the first segmented area.

16. The method of claim 10, further comprising responding to the determined zone axis tilt greater than a threshold zone axis tilt, acquiring a second diffraction pattern of the sample and tilting the sample with a second zone axis tilt determined based on the second diffraction pattern using the trained network.

17. A system for imaging a sample, comprising:
a source for generating a charged particle beam;
a sample holder for tilting the sample;
a detector; and
a controller with instructions stored in a non-transitory memory, the controller is configured to:
direct the charged particle beam towards the sample;
acquire a diffraction pattern of the sample;
using a trained network, segment the diffraction pattern and generate a segmented area of the diffraction pattern corresponding to a Laue circle;
determine a zone axis tilt based on the segmented area; and
tilt the sample based on the determined zone axis tilt.

18. The system of claim 17, wherein the controller is further configured to:
determine a quality factor based on the segmented area; and tilt the sample responsive to the quality factor greater than a threshold quality factor.

19. The system of claim 17, wherein determine the zone axis tilt based on the segmented area includes: determine a location of a Laue circle center in the diffraction pattern based on the segmented area; and determine the zone axis tilt based on the location of the Laue circle center and a location of a direct beam center in the diffraction pattern.

20. The system of claim 17, wherein the charged particle beam is a convergent charged particle beam, and wherein the controller is further configured to acquire an image of the sample by scanning the convergent charged particle beam over the sample after tilting the sample.

* * * * *